United States Patent
Lu et al.

(10) Patent No.: US 11,017,878 B1
(45) Date of Patent: May 25, 2021

(54) MEMORY DEVICE WITH A DYNAMIC FUSE ARRAY

(71) Applicant: Micron Technology, Inc., Boise, ID (US)

(72) Inventors: Yang Lu, Boise, ID (US); Xinyu Wu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/719,911

(22) Filed: Dec. 18, 2019

(51) Int. Cl.
*G11C 29/00* (2006.01)
*G11C 7/10* (2006.01)
*G11C 29/18* (2006.01)

(52) U.S. Cl.
CPC ............ *G11C 29/787* (2013.01); *G11C 7/106* (2013.01); *G11C 7/1087* (2013.01); *G11C 29/18* (2013.01); *G11C 29/789* (2013.01); *G11C 2029/1802* (2013.01)

(58) Field of Classification Search
CPC ..... G11C 29/787; G11C 7/106; G11C 29/789; G11C 29/18; G11C 7/1087; G11C 2029/1802
See application file for complete search history.

(56) References Cited

U.S. PATENT DOCUMENTS

| | | | | |
|---|---|---|---|---|
| 2007/0177429 | A1* | 8/2007 | Nagashima | G11C 16/12 365/185.22 |
| 2011/0280091 | A1* | 11/2011 | Rooney | G11C 29/785 365/200 |
| 2017/0083398 | A1* | 3/2017 | Baek | G11C 29/78 |
| 2017/0110206 | A1* | 4/2017 | Ryu | G11C 29/52 |

\* cited by examiner

*Primary Examiner* — Ajay Ojha
(74) *Attorney, Agent, or Firm* — Holland & Hart LLP

(57) ABSTRACT

Methods, systems, and devices for memory device with a dynamic fuse array are described. Techniques and apparatus are described herein for storing an address of a set of the array of latches that is associated with a set of the array of fuses. A se of an array of fuses may include a first portion for indicating the value of the parameter and a second portion for indicating an address of a set of the array of latches that is to receive the parameter stored in the first portion. An enabled set of fuses may indicate that the block is storing a value of a parameter for operating the memory device. By storing the address for the set of the array latches in the set of the array of fuses, a memory device may have a dynamic mapping between the array of latches and the array of fuses. Such a dynamic mapping may reduce an area used by the array of fuses and may make some parameters modifiable.

20 Claims, 5 Drawing Sheets

MEMORY DEVICE WITH A DYNAMIC FUSE ARRAY

BACKGROUND

The following relates generally to one or more memory systems and more specifically to a memory device with a dynamic fuse array.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Memory devices may use a variety of parameters (e.g., trim parameters) to control operations of the memory device. Examples of these parameters may include one or more timing durations, one or more voltage levels, one or more threshold values or criteria, or combination thereof. These parameters may be embedded in the memory device and may not be known or editable by a host system. An array of fuses (e.g., non-volatile memory) and an array of latches (e.g., volatile memory) may be configured to store these parameters. As part of an initialization operation, the memory device may move the parameters from the array of fuses to the array of latches, which may provide faster access than the array of fuses.

Techniques and apparatus are described herein for storing an address of a set of the array of latches that is associated with a set of the array of fuses. A se of an array of fuses may include a first portion for indicating the value of the parameter and a second portion for indicating an address of a set of the array of latches that is to receive the parameter stored in the first portion. An enabled set of fuses may indicate that the block is storing a value of a parameter for operating the memory device. By storing the address for the set of the array latches in the set of the array of fuses, a memory device may have a dynamic mapping between the array of latches and the array of fuses. Such a dynamic mapping may reduce an area used by the array of fuses and may make some parameters modifiable.

Features of the disclosure are initially described in the context of a system described with reference to FIG. 1. Features of the disclosure are described in the context systems as described with reference to FIGS. 2-3. These and other features of the disclosure are further illustrated by and described with reference to an apparatus diagram and a flowchart that relate to memory device with a dynamic fuse array as described with references to FIGS. 4-5.

Figure 1:
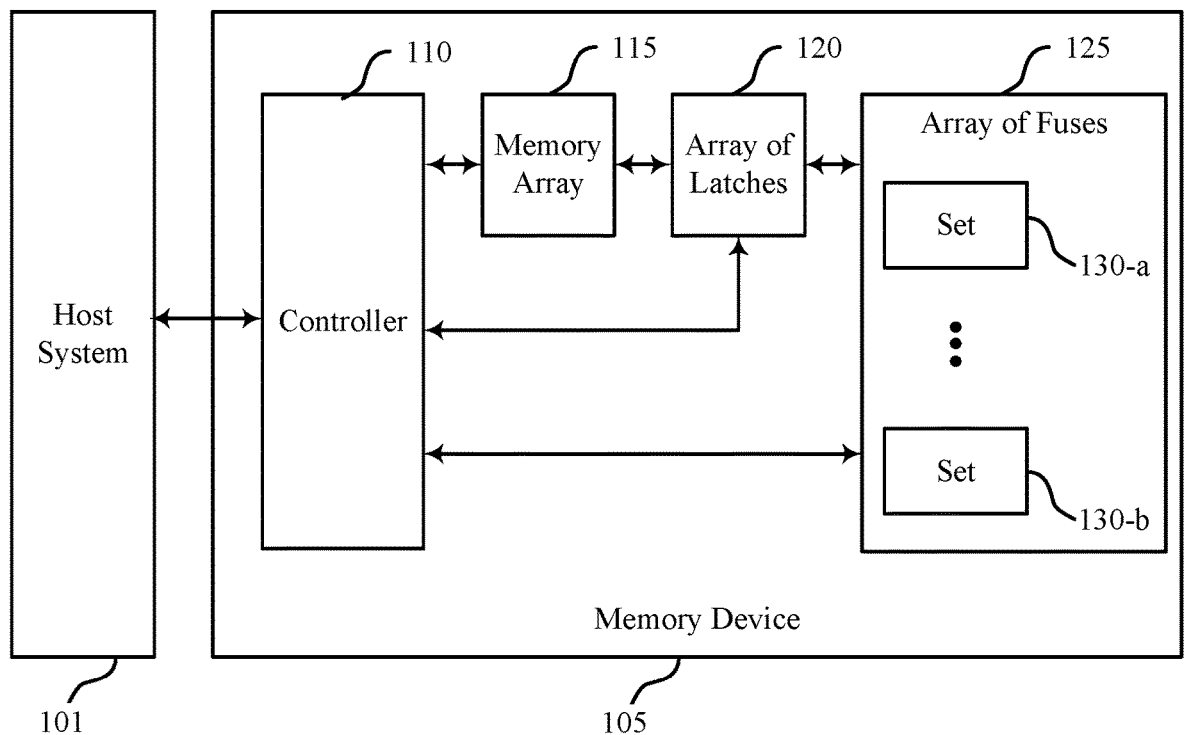
FIG. 1 illustrates an example of a system that supports a memory device with a dynamic fuse array in accordance with examples as disclosed herein.

FIG. 1 illustrates a system 100 that supports apparatuses and techniques for a memory device with a dynamic fuse array in accordance with examples as disclosed herein. The system 100 may include a host system 101 and a memory device 105. The memory device 105 may include a controller 110, a memory array 115, and components for implementing various parameters of the memory array 115. For example, the memory device 105 may include an array of latches 120 for storing one or more parameters or trim parameters and an array of fuses 125.

The system 100 may include the host system 101. The host system 101 may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host system may refer to the hardware, firmware, software, or a combination thereof that implements the functions of an external memory controller. In some cases, the host system 101 may be referred to as a host or host device. The memory device 105 may be configured to store data for the system 100 (e.g., within the memory array 115). In some cases, the memory device 105 may act as a slave-type device to the host system 101 (e.g., responding to and executing commands provided by the host system 101). Such commands may include an access command for an access operation, such as a write command for a write operation, a read command for a read operation, a refresh command for a refresh operation, or other commands.

The memory device 105 may include a memory array 115 with memory cells that are programmable to store different logic states. In some cases, a memory cell within the memory array 115 may be programmable to store two logic states, which may be denoted as a logic 0 and a logic 1. In some cases, a memory cell within the memory array 115 may be programmable to store more than two logic states. In the example of memory device 105, different logic states may be programmed by writing memory cells having configurable material characteristics or material properties that correspond to different logic states, where such material characteristics or material properties (e.g., material states) may be detected during a subsequent read operation to identify a stored logic state. The memory array 115 may include a set of memory sections or elements, which may refer to a contiguous tile of memory cells (e.g., a contiguous set of elements of a semiconductor chip), or a set or bank of more than one contiguous tile of memory cells. In some examples, a memory section, memory element, or a memory tile may refer to the smallest set of memory cells within the memory array 115 that may be biased in an access operation, or a smallest set of memory cells that share a common node (e.g., a common source node, a common source plate, a set of source lines that are biased to a common voltage). In some cases, a memory section may correspond to a set of memory cells associated with a same memory address. For example, the memory device 105 may receive an access command from the host system 101 including an address. Based on receiving the access command and address, the memory device 105 may access the memory section within the memory array 115 associated with the address.

The memory device 105 may include a controller 110. The controller 110 may control the operation (e.g., read operations, write operations, rewrite operations, refresh operations) of memory array 115 through the various components (e.g., a row component for activating a row of memory cells within the memory array 115, a column component for activating a column of memory cells within the memory array 115, a sense component for sensing a logic value of an accessed memory cell). The controller 110 may receive an access command from the host system 101. The access command may include an address corresponding to one or more memory cells within the memory array 115. Based on the address included within the access command, the controller 110 may generate row and column address signals to activate a target first access line (e.g., a word line) and a target second access line (e.g., a digit line). The controller 110 may also generate or control various voltages or currents used during the operation of memory device 105. Although a single controller 110 is shown, a memory device 105 may have more than one controller 110, where different controllers 110 may perform the same functions or different functions.

The memory device 105 may include an array of latches 120. The array of latches 120 may include an array of memory cells programmable to store different logic states. Inputs of the array of latches 120 may include the controller 110 or the array of fuses 125 or both. Outputs of the array of latches 120 may include the memory array 115. Various parameters (e.g., trim parameters) may be used to control operations of the memory device 105. Examples of these parameters may include one or more timing durations, one or more voltage levels, one or more threshold values or criteria, or combination thereof. These parameters may be embedded in the memory device 105 and may not be known or editable by the host system 101. The array of latches 120 may be configured to store these parameters. During operation, the controller 110 may access the array of latches 120 to determine the value of the parameters used to perform an operation. The array of latches 120 may include volatile memory and may lose their state when the memory device 105 powers down. As part of an initialization operation, the memory device 105 may move the parameters from a non-volatile memory (e.g., the array of fuses 125) to the array of latches 120, which may provide faster access than the non-volatile memory. In some cases, a set of latches 120 are mapped to one or more specific parameters such that the controller 110 may know that by accessing a first set of the array of latches 120 the controller may be able to retrieve a value of a first parameter. In this manner, the controller 110 may be configured to obtain a value of a specific parameter by identifying the set of latches of the array of latches 120 associated with that parameter.

The array of fuses 125 may be configured as non-volatile memory store the one or more parameters (e.g., trim parameters) associated with operating the memory device 105. In some cases, the array of fuses 125 may be an array of fuses or an array of anti-fuses. A fuse may refer to a device that, by default, may have a closed connection. A fuse may be programmed to have an open connection based on receiving a voltage that satisfies a threshold. For example, a programming voltage or activation pulse may be applied to a fuse to open a connection across the fuse. An anti-fuse may, by default, may have an open connection. The anti-fuse may be programmed to have a closed connection based on receiving a voltage that satisfies a threshold. For example, a programming voltage or activation pulse may be applied to an anti-fuse to close a connection across the anti-fuse. The open connection may correspond to a high resistance state of a fuse or an anti-fuse while the closed connection may correspond to a low resistance state of the fuse or the anti-fuse. Since fuses and anti-fuses are permanently programmed, the memory within the array of fuses 125 may be considered one-time programmable ROM. The array of fuses 125 may include a set of fuses each associated with parameter stored in the array of fuses 125. The sets 130 may include a first portion for indicating the value of the parameter and a second portion for indicating an address of the array of latches 120 that is to receive the parameter stored in the first portion. In some cases, the set 130 may either be enabled or disabled. An enabled set of fuses may indicate that the block is storing a value of a parameter for operating the memory device 105. Additionally or alternatively, a disabled set of fuses may indicate that the set 130 does not store a parameter.

In some memory systems, a set 130 of the array of fuses 125 may be mapped to a set of the array of latches 120. In such scenarios, many of the sets of the array of fuses may not be used to store any data, which may result in die area being wasted in the array of fuses 125. In addition, in such scenarios, the ability to modify values stored in the array of latches 120 may be limited by the mapping between the array of latches 120 and the array of fuses 125. By incorporating an address of the array of latches in a set 130 of the array of fuses 125 may allow the memory system to dynamically map values stored in the array of fuses 125 to the array of latches 120. In this manner, the size of the array of fuses 125 may be reduced because the amount of redundant storage that occurs from a dedicated mapping between the array of latches 120 and the array of fuses 125 may be reduced. In addition, values of parameters may be changed by writing a value to a different set 130 of the array of fuses 125 that may over-write a different value stored in an earlier set 130. For example, during an initialization operation, the parameter values stores in the sets 130 may be read out and stored in sets of the array of latches 120 in a sequential manner. When using a sequential read, a first set of the array of fuses 125 may indicate to store a first value in a first set of the array of latches 120, and a second set of the array of fuses 125 may indicated to a store a second value in the first set of array of latches 120. In such cases, the second value stored in the second set may overwrite the first value already stored in the first set of the array of latches 120.

Figure 2:
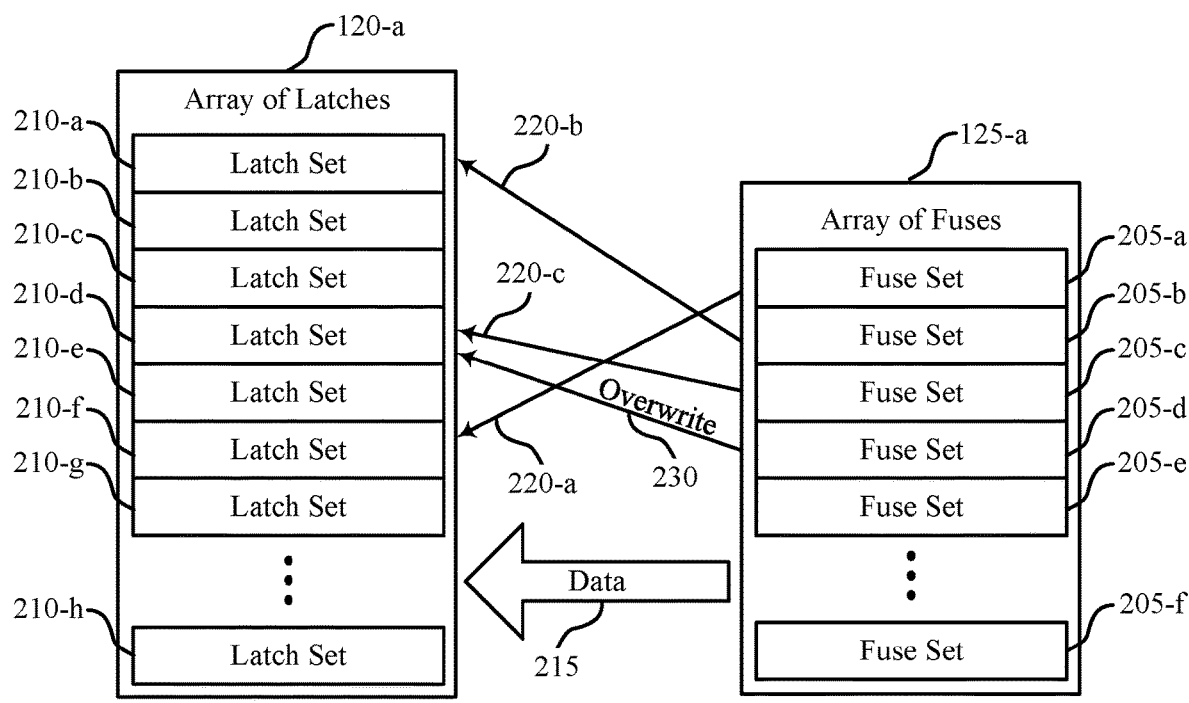
FIG. 2 illustrates an example of a system that supports a memory device with a dynamic fuse array in accordance with examples as disclosed herein.

FIG. 2 illustrates an example of a system 200 that supports a memory device with a dynamic fuse array in accordance with examples as disclosed herein. The system 200 may include aspects of components described with reference to FIG. 1. In some cases, a memory device (e.g., as described with reference to FIG. 1) may use the system 200. Additionally or alternatively, the array of fuses 125-*a* may be an example of the array of fuses 125 as described with reference to FIG. 1, and the array of latches 120-*a* may be an example of the array of latches 120 as described with reference to FIG. 1. The system 200 may illustrate the data 215 being communicated from the array of fuses 125-*a* to the array of latches 120-*a* by data paths 220.

The array of fuses 125-*a* may include one or more sets 205 or fuse sets. A set 205 may be an example of a set 130 described with reference to FIG. 1. Each fuse set 205 may be configured to store data 215 for the operation of the memory device. For example, a fuse set 205 may be used to store data 215 such as parameters associated with operating the memory device. That is, the fuse set 205 may store a trim parameter for the memory device.

In some systems 200, there may be a one-to-one mapping between the array of fuses 125-*a* and the array of latches 120-*a*. That is, the fuse set 205-*a* may store data 215 to be read out to the latch set 210-*a*, the fuse set 205-*b* may store data 215 to be read out to latch set 210-*b*, and so forth. Here, a quantity of fuse sets 205 may be equal to a quantity of latch sets 210. Additionally or alternatively, a number of fuse configurations (e.g., fuses or sets of fuses functioning as a fuse configuration) within the array of fuses 125-*a* may be equal to a number of latches within the array of latches 120-*a*.

For arrays of fuses 125-*a* that use one-to-one mapping, if there is an error associated with a single fuse (e.g., due to a nicked fuse) within the array of fuses 125-*a*, the entire array of fuses 125-*a* may be disabled. For example, if there is a programming error associated with one or more fuses within the array of fuses 125-*a*, the entire array of fuses 125-*a* may be disabled. In another example, if the set of data 215 stored in a fuse set 205 to be output to the latch set 210 changes (e.g., updates, is incorrect), the entire array of fuses 125-*a* may be disabled (e.g., by one or more enable or disable fuses). As a result, a memory device may include multiple arrays of fuses 125-*a* to use if other arrays of fuses 125 are disabled. Here, the arrays of fuses 125 may account for around 1% of an area of the memory device (e.g., 1% of a full-chip size of the memory device). Additionally, a memory device may only use a relatively low portion of the fuses within the array of fuses 125. For example, a memory device may only use 10% of the fuses within all of the array of fuses 125 on the memory device. In such cases, area in the memory device may be occupied by fuses that are not storing data.

System 200 may illustrate an array of fuses 125-*a* with a dynamic mapping between each fuse set 205 and latch set 210. The dynamic mapping may enable the memory device to store data for a specific latch set 210 in any a fuse set 205. Thus, if there is an error associated with a single fuse or fuse set 205, the memory device may program a new fuse set 205 within the same array of fuses 125-*a* to map to the same latch set 210. A dynamic mapping may enable the memory device to decrease a quantity of arrays of fuses 125 included within each memory device. That is, because an error associated with a single fuse or fuse set 205 of the array of fuses 125-*a* does not necessitate disabling the array of fuses 125-*a* and a size of the arrays of fuses 125 may be reduced and still achieve a same or similar level of reliability. As a result, an amount of area within a memory device utilized by the arrays of fuses 125 may be less for the system 200 utilizing a dynamic mapping when compared to a system utilizing a one-to-one mapping. In such systems, though, a quantity of fuses in each set 205 may be higher than a quantity of fuses in each set for an array of fuses that is mapped in a 1-to-1 manner with the array of latches. Additionally or alternatively, a quantity of fuse sets 205 within each array of fuses 125-*a* may be different than (e.g., more than, less than) a quantity of latch sets 210 within the array of latches 120-*a*.

The array of fuses 125-*a* may enable a dynamic mapping by increasing a quantity of fuses (or, in some cases, fuse configuration including more than one fuse or anti-fuse) within each fuse set 205 when compared to a fuse set configured for a one-to-one mapping. For example, each fuse set 205 may include a first quantity of fuses for storing an address of a latch set 210 and a second quantity of fuses for storing the data 215. Thus, when the memory device reads data 215 from the fuse set 205, the memory device may read the address from the first quantity of fuses and may communicate the data 215 to the latch set 210 indicated by the address. If there is an error associated with the data or address within a first fuse set 205 (e.g., fuse set 205-*c*), a second fuse set 205 (e.g., fuse set 205-*d*) may be programmed with the same address (e.g., indicating a same latch set 210-*d*). In some cases, a most-recently programmed fuse set 205 may override a previously-programmed fuse set 205.

During an initialization operation (e.g., when a memory device reads the data within a fuse set 205), the array of fuses 125-*a* may output the data and the address from the fuse set 205. In some cases, the memory device may decode the address (e.g., if the address stored within the first quantity of fuses of the fuse set 205 is encoded) and determine which latch set 210 is associated with the fuse set 205. For example, the memory device may determine that latch set 210-*f* is associated with the fuse set 205-*a*. In another example, the memory device may determine that latch set 210-*a* is associated with the fuse set 205-*b*. The memory device may subsequently broadcast the data bits (e.g., stored within the second quantity of fuses within the fuse set 205) to the indicated latch set 210, thus enabling the memory device to read the data stored within the fuse set 205.

For example, fuse set 205-*c* may be programmed with data to be output to latch set 210-*d*. That is, the fuse set 205-*c* may include a first quantity of fuses storing an address indicating the latch set 210-*d* and a second quantity of fuses storing data 215 to be output to the latch set 210-*d*. Here, if the memory device reads the data associated with the latch set 210-*d*, the memory device may output the data 215 from the latch set 210-*d* by data path 220-*c*. In some cases, there may be an error associated with the fuse set 205-*c*. For example, one or more of the quantity of fuses configured to store the data 215 at the fuse set 205-*c* may be nicked (e.g., outputting an inconsistent logic value). In another example, the data 215 to be output by latch set 210-*d* may be updated. In either example, the data path 220-*c* may be overwritten by new data path 230. Here, the fuse set 205-*d* may be programmed with the same latch address indicating the latch set 210-*d* and the updated or corrected data.

In some cases, each fuse (e.g., within a fuse set 205) may correspond to a fuse configuration including more than one fuse or anti-fuse to improve a reliability of the fuse configuration when compared to a single fuse. For example, a fuse configuration may include multiple fuses and an AND logic gate. To program this fuse configuration, a voltage may be applied to each of the fuses within the fuse configuration and if either (or both) of the fuses are programmed to be open, the output of the fuse configuration may correspond to an open fuse. In another example, the fuse configuration may include multiple anti-fuses and an OR logic gate. To program this fuse configuration, a voltage may be applied to each of the anti-fuses within the fuse configuration and if either (or both) of the anti-fuses are programmed to be closed, the output of the anti-fuse configuration may correspond to a closed fuse. Thus, multiple fuses or anti-fuses may be used as a higher reliability fuse configuration (e.g., when compared to a single fuse or anti-fuse).

Figure 3:
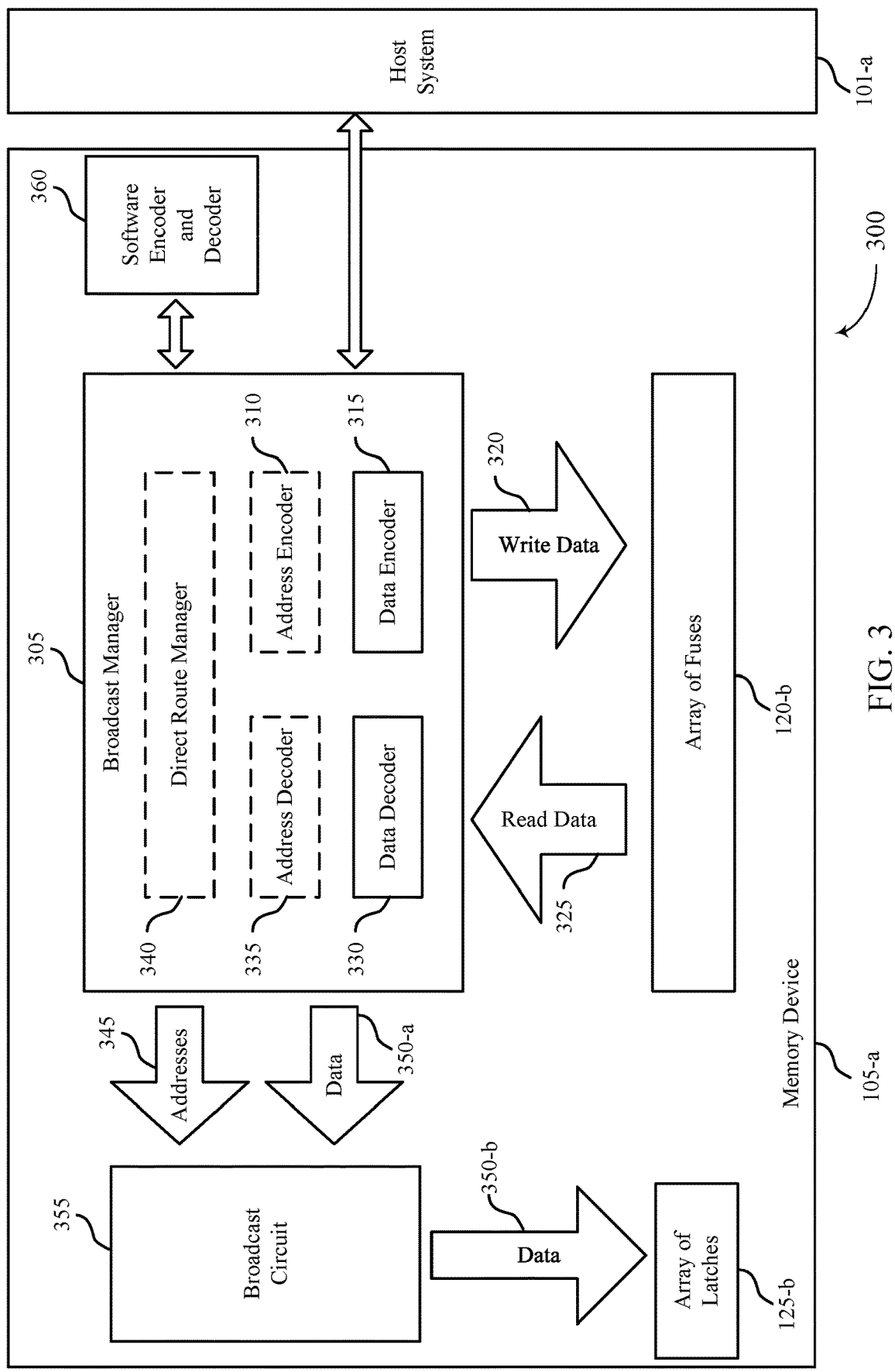
FIG. 3 illustrates an example of a system that supports a memory device with a dynamic fuse array in accordance with examples as disclosed herein.

FIG. 3 illustrates an example of a system 300 that supports a memory device with a dynamic fuse array in accordance with examples as disclosed herein. The system 300 may include components and features similar to other components and features described with reference to FIGS. 1 and 2. For example, the memory device 105-a may be an example of a memory device 105 as described with reference to FIG. 1, the array of fuses 125-b may be an example of the array of fuses 125 described with reference to FIGS. 1 and 2, the array of latches 120-b may be an example of the array of latches 120 described with reference to FIGS. 1 and 2, and the host system 101-a may be an example of the host system 101-a as described with reference to FIG. 1. The system 300 may further include a broadcast manager 305, a broadcast circuit 355, and a software encoder and decoder 360. In some cases, the broadcast manager 305 may be included within a controller of the memory device 105-a.

The memory device 105-a may include the array of fuses 125-b which may include a quantity of fuse sets as described with reference to FIGS. 1 and 2. For example, each fuse set may include a first quantity of fuses configured to store an address indicating a latch set of the array of latches 120-b and a second quantity of fuses configured to store data. The array of fuses 125-b may be in communication with the broadcast manager 305. The broadcast manager 305 may enable a programming of the fuse sets within the array of fuses 125-b. Additionally, the broadcast manager 305 and the broadcast circuit 355 may enable the memory device 105-a or a host system 101-a to read the data stored within the fuse sets by broadcasting the data stored within the fuse set to the appropriate latch set within the array of latches 120-b.

The memory device 105-a may program a fuse set to store data associated with the operation of the memory device 105-a. In some cases, the array of fuses 125-b may be initially programmed with a set of values (e.g., within fuse sets) and corresponding latch set addresses (e.g., based on receiving a write command from a host system 101-a, based on a production of the memory device 105-a). In some cases, there may be an error associated with the data stored within the array of fuses 125-b. For example, a first fuse set within the array of fuses 125-b may be configured to store an improper configuration or trimming parameter (e.g., during a production of the memory device 105-a). In another example, the memory device 105-a may be utilized for a specific purpose not known during production and requiring a different set of parameters. In another example, a fuse within the array of fuses 125-b may be faulty (e.g., nicked). In the case of an error, the host system 101-a may overwrite the data stored within the array of fuses 125-b by programming a new fuse set (e.g., a previously unprogrammed fuse set) to store correct data at the new fuse set.

The host system 101-a may issue a write command to the memory device 105-a to program a fuse set within the array of fuses 125-b to store data this associated with a specific set of the array of latches 120-b. That is, the host system 101-a may issue a write command including a set of data to be stored by a first fuse set within the array of fuses 125-b. The write command may further include an address of a latch set within the array of latches 120-b associated with the data. If the write command writes data associated with a set of the array of latches 120-b that already has some associated, the second data may overwrite the previous data during an initialization operation. The broadcast manager 305 may receive the write command and program the first fuse set with the address and the data. In the event that the host system 101-a communicates a read command to the memory device 105-a to read the data, the broadcast manager 305 may read data from the array of fuses 125-b that was most-recently programmed with the latch address or the broadcast manager 305 may read all data in the array of fuses 125-b in a sequential manner such that the last data stored in the array of fuses 125-b ends up being stored in the associated set of the array of latches 120-b.

For a programming operation, the broadcast manager 305 may receive the data to be stored within a fuse set of the array of fuses 125-b. For example, the host system 101-a may communicate a write command including the data. The data encoder 315 within the broadcast manager 305 may encode the data to be stored within a fuse set of the array of fuses 125-b. In some cases, the broadcast manager 305 may additionally receive an address of a latch set within the array of latches 120-b associated with the data to be stored within the array of fuses 125-b. In some cases, the broadcast manager 305 may, optionally, encode the address of the latch set by the address encoder 310. In some cases, the address encoder 310 may be optionally included to identify an address of the array of fuses 125-b to store the data received from the host system 101-a. In some cases, the data may be stored in the array of fuses 125-b in a sequential manner and individual addresses of the array of fuses 125-b may not be identified by the address encoder 310. The address encoder 310 and the data encoder 315 may be hardware encoders. That is, the address encoder 310 and the data encoder 315 may include circuitry within the memory device 105-a to encode the address and data respectively. In some examples, the broadcast manager may communicate the address and data to a software encoder and decoder 360. Here, the software encoder and decoder 360 may encode the data or the data and the address and communicate the encoded data and address back to the broadcast manager 305. In some cases, the broadcast manager 305 may not encode the data or the address prior to communicating the data and address to the array of fuses 125-b. Here, the direct route manager 340 may communicate the data and address to the array of fuses 125-b (e.g., instead of the address encoder 310 or the data encoder 315).

The broadcast manager 305 may communicate the write data 320 to the array of fuses 125-b. The write data 320 may include the data to be stored within a fuse set of the array of fuses 125-b and an address of a latch set within the array of latches 120-b associated with the data. In some cases, the address of the latch set may be encoded, the data may be encoded, or both the address and the data may be encoded. The fuse set within the array of fuses 125-b may be programmed to store the write data 320.

For a read operation, the broadcast manager 305 may read the read data 325 from a fuse set within the array of fuses 125-b indicated by a read command. For example, the host system 101-a may communicate a read command to the memory device 105-a. The read data 325 may include an address corresponding to a latch set within the array of latches 120-b (e.g., stored within a first quantity of fuses of the fuse set) and data (e.g., stored within a second quantity of fuses of the fuses set). In some cases, the address, the data, or both may be encoded. For example, the broadcast manager 305 may include circuitry (e.g., the address encoder 310, the data encoder 315) to encode the address or the data. In another example, the broadcast manager may utilize a software encoder and decoder 360 to encode the address or the data prior to programming the set of fuses. The broadcast manager 305 may read the data and address from the set of fuses 125-b indicated by the read command.

To decode the encoded data included within the read data 325, the broadcast manager may communicate the encoded data to the data decoder 330. The data decoder 330 may be a hardware decoder including circuitry to decode the data based on the data encoder 315. That is, the data decoder 330 may decode the data if the data encoder 315 encoded the data. In some other cases, the broadcast manager 305 may communicate the encoded data included within the read data 325 to the software encoder and decoder 360 to decode the dat. For example, if the software encoder and decoder 360 encoded the data, the broadcast manager may communicate the data included within the read data 325 to the software encoder and decoder 360. Here, the software encoder and decoder 360 may decode the data and communicate the data back to the broadcast manager 305. In either case, the data included within the read data 325 may be decoded. If the data and the address within the read data 325 are not encoded, the broadcast manager 305 may communicate the read data 325 to the direct route manager 340 (e.g., instead of the data decoder 330 or the address decoder 335). The direct route manager 340 may manage broadcasting read data 325 that is not encoded. In some cases, the broadcast manager 305 may include an address decoder 335 may be configured to decode the address of the set of the array of latches 120-b. In some cases, the address may be transmitted to array of latches 120-b without the address decoder 335 decoding the address.

The broadcast manager 305 may communicate the address 345 and the data 350-a to a broadcast circuit 355. The broadcast circuit 355 may, in some cases, be included within the broadcast manager 305. The broadcast circuit 355 may determine, based on the received address 345, a latch set within the array of latches 120-b that is to receive the data 350-b. The broadcast circuit 355 may broadcast the data 350-b to the indicated latch set within the array of latches 120-b. That is, the broadcast circuit 355 may include a driver operable to drive a voltage of one or more buses within the memory device 105-a to voltage levels corresponding to the data 350-b. The latch set may output the data based on receiving the data 350-b. Thus, the host system 101-a or the memory device 105-a may monitor the latch set to read the data stored within a fuse set.

Figure 4:
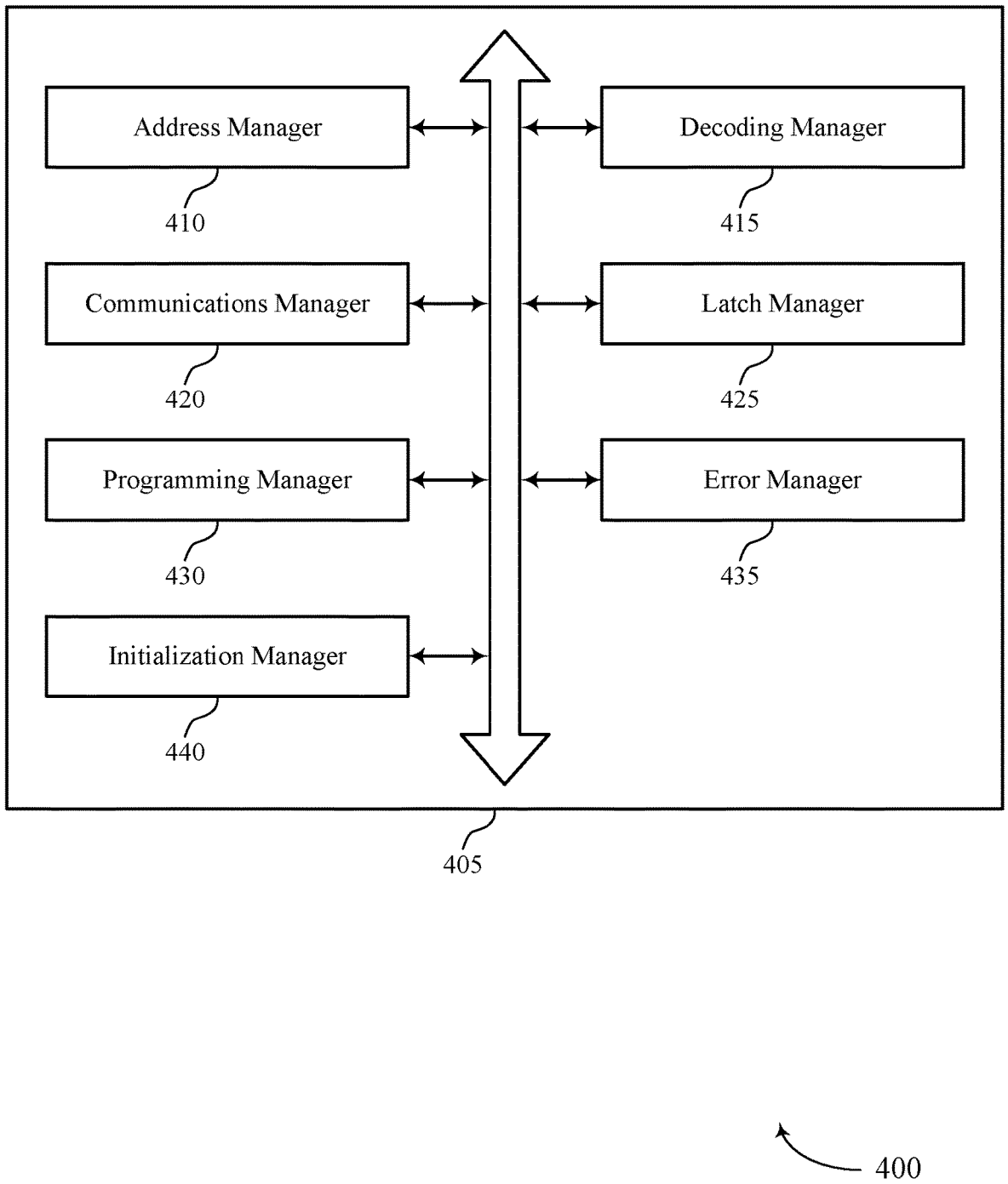
FIG. 4 shows a block diagram of a memory device that supports a memory device with a dynamic fuse array in accordance with examples as disclosed herein.

FIG. 4 shows a block diagram 400 of a memory device 405 that supports a memory device with a dynamic fuse array in accordance with examples as disclosed herein. The memory device 405 may be an example of aspects of a memory device as described with reference to FIGS. 1-3. The memory device 405 may include an address manager 410, a decoding manager 415, a communications manager 420, a latch manager 425, a programming manager 430, an error manager 435, and an initialization manager 440. Each of these modules may communicate, directly or indirectly, with one another (e.g., via one or more buses).

The address manager 410 may read, from a set of fuses in a memory device, data and an address indicating a set of latches of the memory device for receiving the data, the set of fuses for storing at least one parameter for operating the memory device. In some examples, the address manager 410 may read, from the second set of fuses in the memory device and after reading the data from the set of fuses, the second data and the address indicating the set of latches for receiving the second data, where reading the second data from the second set of fuses is based on programming the second set of fuses.

In some examples, the address manager 410 may identify, by a controller, the set of fuses for storing the data, where programming the fuses is based on identifying the set of fuses. In some cases, the set of fuses in the memory device is configured to store data associated with any set of latches within an array of latches that includes the set of latches. In some cases, the address includes a first quantity of bits and the data includes a second quantity of bits. In some cases, the set of fuses includes a first quantity of fuses configured to store the address and a second quantity of fuses configured to store the data. In some cases, the set of latches includes a second quantity of latches configured to store the data.

The decoding manager 415 may decode the address to identify the set of latches for receiving the data based on reading the address from the set of fuses.

The communications manager 420 may communicate the data to the set of latches indicated by the address stored in the set of fuses based on identifying the set of latches. In some examples, the communications manager 420 may communicate the second data to the set of latches indicated by the address stored in the second set of fuses based on reading the address from the second set of fuses. In some examples, the communications manager 420 may receive, from a host device, a command to read the data and the address from the set of fuses, where reading the data and the address from the set of fuses is based on receiving the command. In some examples, the communications manager 420 may communicate the address to the set of latches based on decoding the address.

The latch manager 425 may store the data in the set of latches based on communicating the data to the set of latches.

The programming manager 430 may identify second data different than the data to be communicated to the set of latches. In some examples, the programming manager 430 may program a second set of fuses in the memory device to store the second data and the address indicating the set of latches for receiving the second data based on the determining. In some examples, the programming manager 430 may encode the second data and the address prior to programming the second set of fuses, where the second data and the address are encoded.

The error manager 435 may identify an error associated with the data or the set of fuses, where the second data is programmed based on identifying the error.

The initialization manager 440 may determine to perform an initialization sequence at the memory device, where reading the data and the address from the set of fuses is based on determining to execute the initialization sequence.

Figure 5:
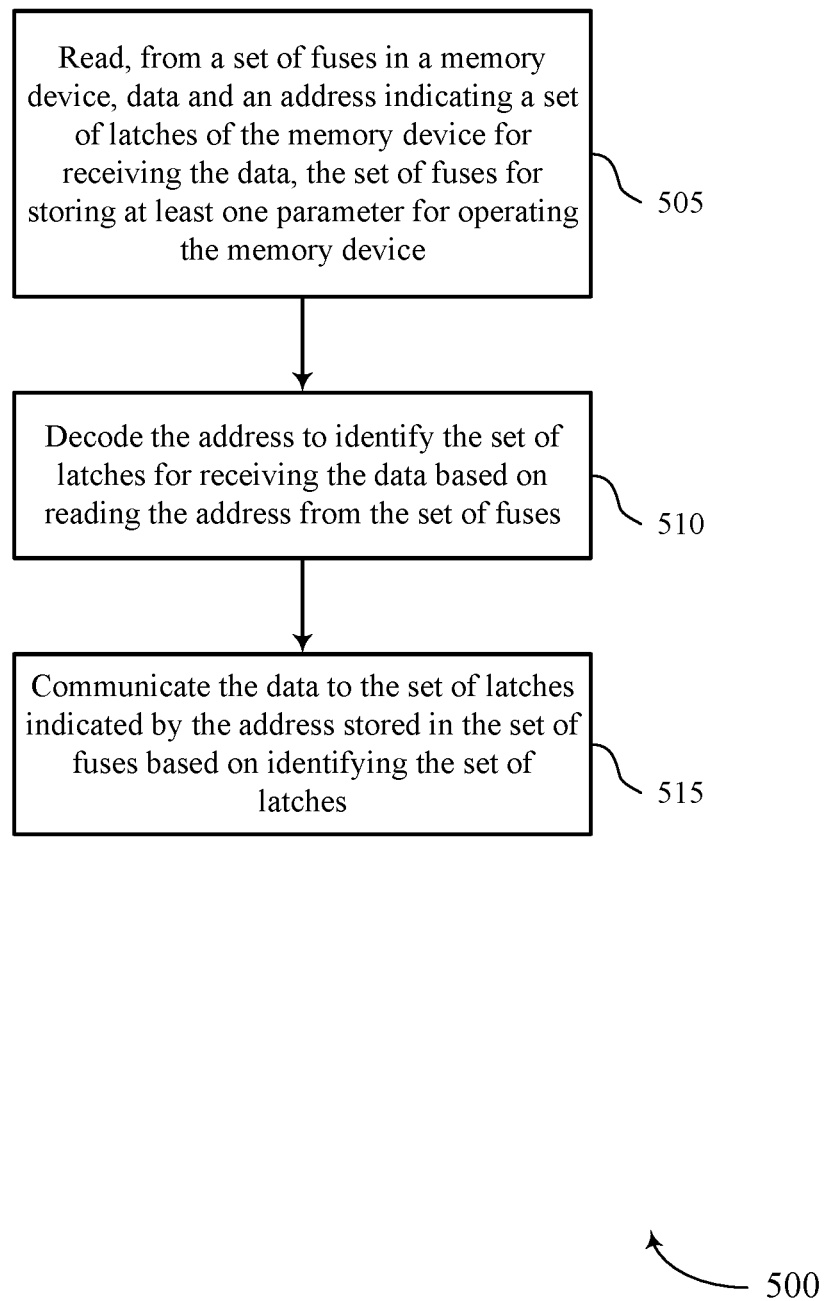
FIG. 5 shows a flowchart illustrating a method or methods that support memory device with a dynamic fuse array in accordance with examples as disclosed herein.

FIG. 5 shows a flowchart illustrating a method or methods 500 that supports a memory device with a dynamic fuse array in accordance with examples as disclosed herein. The operations of method 500 may be implemented by a memory device or its components as described herein. For example, the operations of method 500 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 505, the memory device may read, from a set of fuses in a memory device, data and an address indicating a set of latches of the memory device for receiving the data, the set of fuses for storing at least one parameter for operating the memory device. The operations of 505 may be performed according to the methods described herein. In some examples, aspects of the operations of 505 may be performed by an address manager as described with reference to FIG. 4.

At 510, the memory device may decode the address to identify the set of latches for receiving the data based on reading the address from the set of fuses. The operations of 510 may be performed according to the methods described herein. In some examples, aspects of the operations of 510 may be performed by a decoding manager as described with reference to FIG. 4.

At 515, the memory device may communicate the data to the set of latches indicated by the address stored in the set of fuses based on identifying the set of latches. The operations of 515 may be performed according to the methods described herein. In some examples, aspects of the operations of 515 may be performed by a communications manager as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for reading, from a set of fuses in a memory device, data and an address indicating a set of latches of the memory device for receiving the data, the set of fuses for storing at least one parameter for operating the memory device, decoding the address to identify the set of latches for receiving the data based on reading the address from the set of fuses, and communicating the data to the set of latches indicated by the address stored in the set of fuses based on identifying the set of latches.

Some examples of the method 500 and the apparatus described herein may further include operations, features, means, or instructions for storing the data in the set of latches based on communicating the data to the set of latches. Some examples of the method 500 and the apparatus described herein may further include operations, features, means, or instructions for identifying second data different than the data to be communicated to the set of latches, and programming a second set of fuses in the memory device to store the second data and the address indicating the set of latches for receiving the second data based on the determining.

Some examples of the method 500 and the apparatus described herein may further include operations, features, means, or instructions for reading, from the second set of fuses in the memory device and after reading the data from the set of fuses, the second data and the address indicating the set of latches for receiving the second data, where reading the second data from the second set of fuses may be based on programming the second set of fuses, and communicating the second data to the set of latches indicated by the address stored in the second set of fuses based on reading the address from the second set of fuses. Some examples of the method 500 and the apparatus described herein may further include operations, features, means, or instructions for encoding the second data and the address prior to programming the second set of fuses, where the second data and the address may be encoded. Some examples of the method 500 and the apparatus described herein may further include operations, features, means, or instructions for identifying an error associated with the data or the set of fuses, where the second data may be programmed based on identifying the error.

Some examples of the method 500 and the apparatus described herein may further include operations, features, means, or instructions for identifying, by a controller, the set of fuses for storing the data, where programming the fuses may be based on identifying the set of fuses. Some examples of the method 500 and the apparatus described herein may further include operations, features, means, or instructions for receiving, from a host device, a command to read the data and the address from the set of fuses, where reading the data and the address from the set of fuses may be based on receiving the command.

Some examples of the method 500 and the apparatus described herein may further include operations, features, means, or instructions for determining to perform an initialization sequence at the memory device, where reading the data and the address from the set of fuses may be based on determining to execute the initialization sequence. Some examples of the method 500 and the apparatus described herein may further include operations, features, means, or instructions for communicating the address to the set of latches based on decoding the address.

In some examples of the method 500 and the apparatus described herein, the set of fuses in the memory device may be configured to store data associated with any set of latches within an array of latches that includes the set of latches. In some examples of the method 500 and the apparatus described herein, the address includes a first quantity of bits and the data includes a second quantity of bits, the set of fuses includes a first quantity of fuses configured to store the address and a second quantity of fuses configured to store the data, and the set of latches includes a second quantity of latches configured to store the data.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include set of latches that are each configured to receive data stored within an array of fuses. The array of fuses may include sets of fuses and each set of fuses may include a first quantity of fuses for storing an address of a set of latches associated with the set of fuses, and a second quantity of fuses for storing data associated with an operation of the apparatus. The apparatus may further include an address decoder operable to decode the address received from the array of fuses to determine the set of latches for receiving the data, and a driver operable to communicate the data stored in the set of fuses to the set of latches based on decoding the address.

Some examples of the apparatus may include an address encoder operable to encode the address prior to the first quantity of fuses being programmed for storing the address, where the address encoder may be implemented in hardware or software. In some examples, the driver may be further operable to communicate the address stored in the set of fuses to the set of latches based on decoding the address. In some examples, each set of fuses of the array of fuses may be operable to store data to be communicated to any set of latches. Some examples of the apparatus may include a data encoder operable to encode the data prior to the second quantity of fuses being programmed for storing the data associated with the operation of the apparatus, and a data decoder operable to decode the data received from the array of fuses prior to the data being communicated to the set of latches.

Some examples of the apparatus may include a first set of fuses storing the address of a first set of latches and first data associated with the operation of the apparatus, and a second set of fuses storing the address of the first set of latches and second data associated with the operation of the apparatus, the second data different than the first data. In some examples, an error may be associated with the first set of fuses or the first data, and the second set of fuses store the address of the first set of latches and the second data based on the error associated with the first set of fuses or the first data.

An apparatus is described. The apparatus may include a processor, memory coupled with the processor, instructions stored in the memory and executable by the processor to cause the apparatus to read, from a set of fuses in a memory device, data and an address indicating a set of latches of the memory device for receiving the data, the set of fuses for storing at least one parameter for operating the memory device, decode the address to identify the set of latches for receiving the data based at least in part on reading the address from the set of fuses, and communicate the data to the set of latches indicated by the address stored in the set of fuses based at least in part on identifying the set of latches.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
reading, from a set of fuses of an array of fuses in a memory device, data from a first quantity of fuses and an address from a second quantity of fuses indicating a set of latches of an array of latches of the memory device for receiving the data, the set of fuses for storing at least one parameter for operating the memory device;
decoding the address;
determining a dynamic mapping between the array of fuses and the array of latches based at least in part on reading the address from the set of fuses; and
communicating the data to the set of latches indicated by the address stored in the set of fuses based at least in part on determining the dynamic mapping.

2. The method of claim 1, further comprising:
storing the data in the set of latches based at least in part on communicating the data to the set of latches.

3. A method comprising:
reading, from a set of fuses in a memory device, data and an address indicating a set of latches of the memory device for receiving the data, the set of fuses for storing at least one parameter for operating the memory device;
identifying second data different than the data to be communicated to the set of latches;
programming a second set of fuses in the memory device to store the second data and the address indicating the set of latches for receiving the second data based at least in part on the identifying;
decoding the address to identify the set of latches for receiving the data based at least in part on reading the address from the set of fuses; and
communicating the data to the set of latches indicated by the address stored in the set of fuses based at least in part on identifying the set of latches.

4. The method of claim 3, further comprising:
reading, from the second set of fuses in the memory device and after reading the data from the set of fuses, the second data and the address indicating the set of latches for receiving the second data, wherein reading the second data from the second set of fuses is based at least in part on programming the second set of fuses; and communicating the second data to the set of latches indicated by the address stored in the second set of fuses based at least in part on reading the address from the second set of fuses.

5. The method of claim 3, further comprising:
encoding the second data and the address prior to programming the second set of fuses, wherein the second data and the address are encoded.

6. The method of claim 3, further comprising:
identifying an error associated with the data or the set of fuses, wherein the second data is programmed based at least in part on identifying the error.

7. The method of claim 1, further comprising:
identifying, by a controller, the set of fuses for storing the data, wherein programming fuses is based at least in part on identifying the set of fuses.

8. The method of claim 1, further comprising:
receiving, from a host device, a command to read the data and the address from the set of fuses, wherein reading the data and the address from the set of fuses is based at least in part on receiving the command.

9. The method of claim 1, further comprising:
determining to perform an initialization sequence at the memory device, wherein reading the data and the address from the set of fuses is based at least in part on determining to execute the initialization sequence.

10. The method of claim 1, further comprising:
communicating the address to the set of latches based at least in part on decoding the address.

11. The method of claim 1, wherein the set of fuses in the memory device is configured to store data associated with any set of latches within the array of latches that comprises the set of latches.

12. The method of claim 1, wherein:
the address comprises a first quantity of bits and the data comprises a second quantity of bits;
the set of fuses comprises the first quantity of fuses configured to store the address and the second quantity of fuses configured to store the data; and
the set of latches comprises a second quantity of latches configured to store the data.

13. An apparatus, comprising:
sets of latches of an array of latches that are each configured to receive data stored within an array of fuses, wherein the array of fuses comprises sets of fuses and each set of fuses comprises:
a first quantity of fuses for storing an address of a set of latches associated with the set of fuses; and
a second quantity of fuses for storing data associated with an operation of the apparatus;
an address decoder operable to decode the address received from the array of fuses to determine a dynamic mapping between the array of fuses and the array of latches; and
a driver operable to communicate the data stored in the set of fuses to the set of latches based at least in part on decoding the address.

14. An apparatus, comprising:
sets of latches that are each configured to receive data stored within an array of fuses, wherein the array of fuses comprises sets of fuses and each set of fuses comprises:
a first quantity of fuses for storing an address of a set of latches associated with the set of fuses; and
a second quantity of fuses for storing data associated with an operation of the apparatus;
an address decoder operable to decode the address received from the array of fuses to determine the set of latches for receiving the data;
an address encoder operable to encode the address prior to the first quantity of fuses being programmed for storing the address, wherein the address encoder is implemented in hardware or software; and
a driver operable to communicate the data stored in the set of fuses to the set of latches based at least in part on decoding the address.

15. The apparatus of claim 13, wherein the driver is further operable to communicate the address stored in the set of fuses to the set of latches based at least in part on decoding the address.

16. The apparatus of claim 13, wherein each set of fuses of the array of fuses is operable to store data to be communicated to any set of latches.

17. An apparatus, comprising:
sets of latches that are each configured to receive data stored within an array of fuses, wherein the array of fuses comprises sets of fuses and each set of fuses comprises:
a first quantity of fuses for storing an address of a set of latches associated with the set of fuses; and
a second quantity of fuses for storing data associated with an operation of the apparatus;
an address decoder operable to decode the address received from the array of fuses to determine the set of latches for receiving the data;
a driver operable to communicate the data stored in the set of fuses to the set of latches based at least in part on decoding the address;
a data encoder operable to encode the data prior to the second quantity of fuses being programmed for storing the data associated with the operation of the apparatus; and
a data decoder operable to decode the data received from the array of fuses prior to the data being communicated to the set of latches.

18. The apparatus of claim 13, the array of fuses further comprising:
a first set of fuses storing the address of a first set of latches and first data associated with the operation of the apparatus; and
a second set of fuses storing the address of the first set of latches and second data associated with the operation of the apparatus, the second data different than the first data.

19. An apparatus, comprising:
sets of latches that are each configured to receive data stored within an array of fuses, wherein the array of fuses comprises sets of fuses and each set of fuses comprises:
a first quantity of fuses for storing an address of a set of latches associated with the set of fuses; and
a second quantity of fuses for storing data associated with an operation of the apparatus;
a first set of fuses storing the address of a first set of latches and first data associated with the operation of the apparatus, wherein an error is associated with the first set of fuses or the first data;
a second set of fuses storing the address of the first set of latches and second data associated with the operation of the apparatus, the second data different than the first data, wherein the second set of fuses store the address of the first set of latches and the second data based at least in part on the error associated with the first set of fuses or the first data;

an address decoder operable to decode the address received from the array of fuses to determine the set of latches for receiving the data; and a driver operable to communicate the data stored in the set of fuses to the set of latches based at least in part on decoding the address.

20. An apparatus, comprising:

a processor, memory coupled with the processor, and instructions stored in the memory and executable by the processor to cause the apparatus to:

read, from a set of fuses of an array of fuses in a memory device, data from a first quantity of fuses and an address from a second quantity of fuses indicating a set of latches of an array of latches of the memory device for receiving the data, the set of fuses for storing at least one parameter for operating the memory device;

decode the address;

determining a dynamic mapping between the array of fuses and the array of latches based at least in part on reading the address from the set of fuses; and communicate the data to the set of latches indicated by the address stored in the set of fuses based at least in part on determining the dynamic mapping.

\* \* \* \* \*